(12) United States Patent
Anderson et al.

(10) Patent No.: US 7,772,647 B2
(45) Date of Patent: Aug. 10, 2010

(54) STRUCTURE AND DESIGN STRUCTURE HAVING ISOLATED BACK GATES FOR FULLY DEPLETED SOI DEVICES

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 12/136,213

(22) Filed: Jun. 10, 2008

(65) Prior Publication Data

US 2009/0302366 A1 Dec. 10, 2009

(51) Int. Cl.
*H01L 27/108* (2006.01)
(52) U.S. Cl. ............ 257/348; 257/301; 257/347; 257/E21.63; 257/E21.631
(58) Field of Classification Search .......... 257/301, 257/347, 348, E21.63, E21.631
See application file for complete search history.

(56) References Cited

U.S. PATENT DOCUMENTS

| | | |
|---|---|---|
| 5,942,781 A | 8/1999 | Burr et al. |
| 6,072,217 A | 6/2000 | Burr |
| 6,100,567 A | 8/2000 | Burr |
| 6,434,041 B2 | 8/2002 | Forbes |
| 2002/0060338 A1 | 5/2002 | Zhang |
| 2003/0123273 A1 | 7/2003 | Namekawa et al. |
| 2004/0108552 A1* | 6/2004 | Azuma et al. ............ 257/347 |
| 2007/0138533 A1 | 6/2007 | Dennard et al. |
| 2008/0258221 A1 | 10/2008 | Dennard et al. |
| 2009/0108314 A1 | 4/2009 | Cai et al. |

OTHER PUBLICATIONS

U.S. Appl. No. 12/136,206, filed Jun. 10, 2008, Notice of Allowance dated Aug. 13, 2009.

\* cited by examiner

*Primary Examiner*—Tan N Tran
(74) *Attorney, Agent, or Firm*—Anthony Canale; Hoffman Warnick LLC

(57) ABSTRACT

Methods, structure and design structure having isolated back gates for fully depleted semiconductor-on-insulator (FDSOI) devices are presented. In one embodiment, a method may include providing a FDSOI substrate having a SOI layer over a buried insulator over a first polarity-type substrate, the first polarity-type substrate including a second polarity-type well therein of opposite polarity than the first polarity; forming a trench structure in the FDSOI substrate; forming an active region to each side of the trench structure in the SOI layer; and forming a PFET on the active region on one side of the trench structure and an NFET on the active region on the other side of the trench structure.

20 Claims, 8 Drawing Sheets

US 7,772,647 B2

STRUCTURE AND DESIGN STRUCTURE HAVING ISOLATED BACK GATES FOR FULLY DEPLETED SOI DEVICES

This application is related to U.S. Ser. No. 12/136,206, filed Jun. 10, 2008, currently pending.

BACKGROUND

1. Technical Field

The disclosure relates generally to integrated circuit (IC) chip fabrication, and more particularly, to isolating back gates for fully depleted semiconductor-on-insulator devices.

2. Background Art

Doped well regions in the substrate silicon of a semiconductor-on-insulator (SOI) wafer can be used as back gates for fully depleted (FDSOI) transistors. In typical CMOS circuitry, the close proximity of PFETs to NFETs make it very difficult to independently gate both types of FETs since the wells will either merge and short circuit, or a common gate (p-type) with a separate n-well gate must be used. In the first instance, a large density penalty must be paid, in the second, all (of one type) gates must be globally connected, prohibiting many circuit applications.

SUMMARY

Methods, structure and design structure having isolated back gates for fully depleted semiconductor-on-insulator (FDSOI) devices are presented. In one embodiment, a method may include providing a FDSOI substrate having a SOI layer over a buried insulator over a first polarity-type substrate, the first polarity-type substrate including a second polarity-type well therein of opposite polarity than the first polarity; forming a trench structure in the FDSOI substrate; forming an active region to each side of the trench structure in the SOI layer; and forming a PFET on the active region on one side of the trench structure and an NFET on the active region on the other side of the trench structure. A structure may include a FDSOI device and a second FDSOI device; and a first well below the first FDSOI device and a second well below the second FDSOI device, wherein the first well and the second well are isolated by a memory storage element trench structure.

A first aspect of the disclosure provides a method comprising: providing a fully depleted semiconductor-on-insulator (FDSOI) substrate having a semiconductor-on-insulator (SOI) layer over a buried insulator over a first polarity-type substrate, the first polarity-type substrate including a second polarity-type well therein of opposite polarity than the first polarity; forming a trench structure in the FDSOI substrate; forming an active region to each side of the trench structure in the SOI layer; and forming a p-type field effect transistor (PFET) on the active region on one side of the trench structure and an n-type field effect transistor (NFET) on the active region on the other side of the trench structure.

A second aspect of the disclosure provides a method comprising: providing a fully depleted semiconductor-on-insulator (FDSOI) substrate having a semiconductor-on-insulator (SOI) layer over a buried insulator over a p-type substrate, the p-type substrate including an n-well therein; forming a memory storage element trench structure in the FDSOI substrate; forming an active region to each side of the memory storage element trench structure in the SOI layer; and forming a p-type field effect transistor (PFET) on the active region on one side of the memory storage element trench structure and an n-type field effect transistor (NFET) on the active region on the other side of the memory storage element trench structure, wherein the memory storage element trench structure separates the n-well into a first well and a second well that constitute back gates for the PFET and the NFET.

A third aspect is directed to a structure comprising: a first fully depleted semiconductor-on-insulator (FDSOI) device and a second FDSOI device; and a first well below the first FDSOI device and a second well below the second FDSOI device, wherein the first well and the second well are isolated by a memory storage element trench structure.

A fourth aspect is directed to a design structure embodied in a machine readable medium for designing, manufacturing, or testing an integrated circuit, the design structure comprising: a first fully depleted semiconductor-on-insulator (FDSOI) device and a second FDSOI device; and a first well below the first FDSOI device and a second well below the second FDSOI device, wherein the first well and the second well are isolated by a memory storage element trench structure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
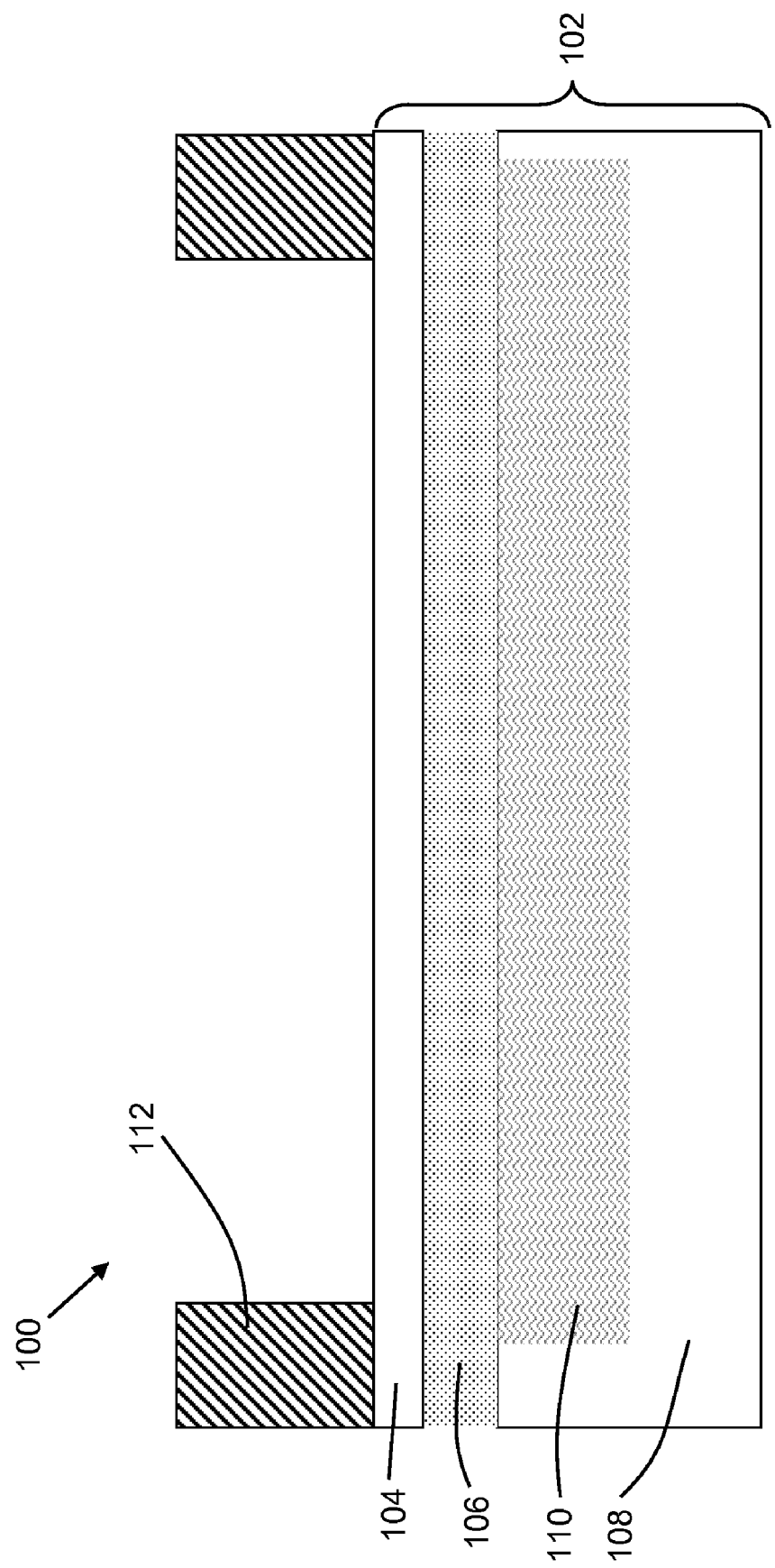
FIGS. 1-7 show embodiments of a method according to the disclosure, with FIGS. 6 and 7 showing a structure according to the disclosure.
Figure 2:
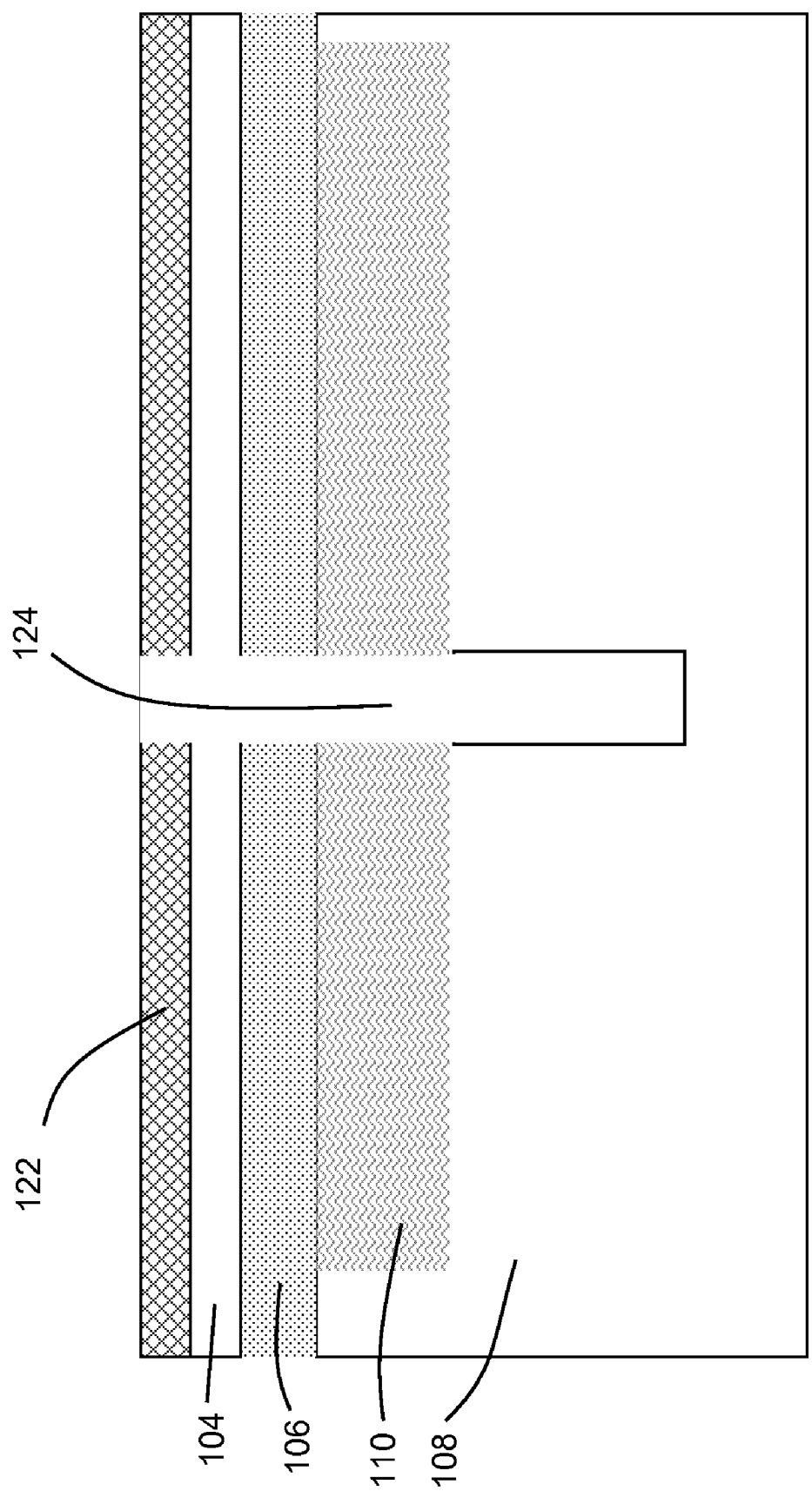
Figure 3:
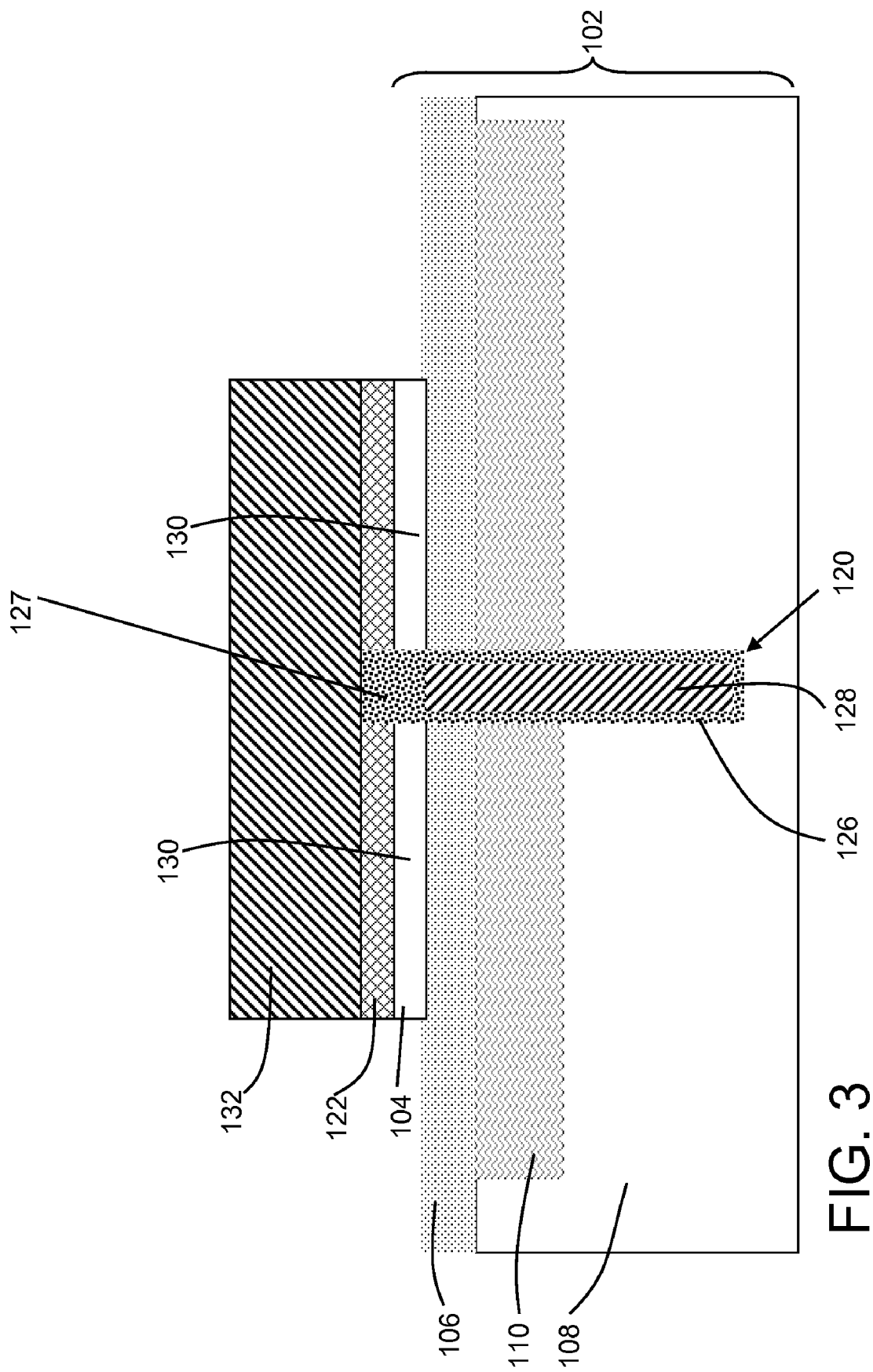

Referring to the drawings, FIG. 1 shows an initial structure 100 that is provided in preparation for methods according to the disclosure. Structure 100 includes a fully depleted semiconductor-on-insulator (FDSOI) substrate 102 having a semiconductor-on-insulator (SOI) layer 104 over a buried insulator 106, e.g., silicon dioxide ($SiO_2$), over a first polarity-type substrate 108. For purposes of description, the first polarity-type is p-type. P-type substrate 108 may include a well 110 therein having a second polarity-type opposite the first polarity, i.e., in this case n-type. It is understood, however, that while a p-type substrate with an n-well therein is described, the polarity types may be reversed throughout this disclosure (e.g., an n-type substrate with a p-well therein may equally be employed to affect the disclosure). Well 100 may be formed, for example, via ion implantation using a well mask 112. SOI layer 104 and p-type substrate 108 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 108 and SOI layer 104 may be strained. FIGS. 2-3 show forming a trench structure 120 (FIG. 3) in FDSOI substrate 102. Trench structure 120 may be formed using any now known or later developed technique. In one embodiment, a pad layer 122 is formed including various layers of, for example, silicon nitride ($Si_3N_4$) and silicon dioxide ($SiO_2$). Pad layer 122 is then patterned and etched, and then SOI substrate 102 is etched to form a trench 124. Trench 124 extends beyond a lower surface of n-well 110. In one embodiment, trench structure 120 constitutes a memory storage element, e.g., a dynamic random access memory (DRAM) cell or trench capacitor. It is understood that trench structure 120 is not the same as typical isolation trench, e.g., filled with silicon oxide, used for isolation between wells, which does not constitute a memory storage element. Those with skill in the art will recognize that isolation trenches are located elsewhere and have been omitted from the drawings for clarity. In addition, typical isolation trenches have a long, narrow extent, which the present trench structure 120 does not include. In this case, trench structure 120 may have a low aspect ratio rectangular shape (horizontally), which, in one embodiment, is no greater than about 2:1 (length-to-width). Trench structure 120 may include trench 124 lined with a dielectric material 126 and further filled with a conductor 128 adjacent to the dielectric material. Dielectric material 126 may include any now known or later developed insulator appropriate for forming a trench capacitor, e.g., silicon oxide, silicon nitride, silicon oxynitride, high-k material having a relative permittivity above about 10, or any combination of these materials. Examples of high-k material include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$, where x, y, and z represent relative proportions, each greater than or equal to zero and x+y+z=1 (1 being the total relative mole quantity). Conductor 128 may include, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. Conductor 128 may further include dopants. In one embodiment, conductor 128 includes doped polysilicon. Methods for forming dielectric material 126 and conductor 128 include but are not limited to thermal oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition.

After conductor 128 formation, chemical mechanical polishing (CMP) to pad layer 122 may be completed. Subsequently, conductor 128 may be recessed, e.g., via a reactive ion etch (RIE), and the opening may be back filled with dielectric material 127, as shown in FIG. 3.

Figure 4:
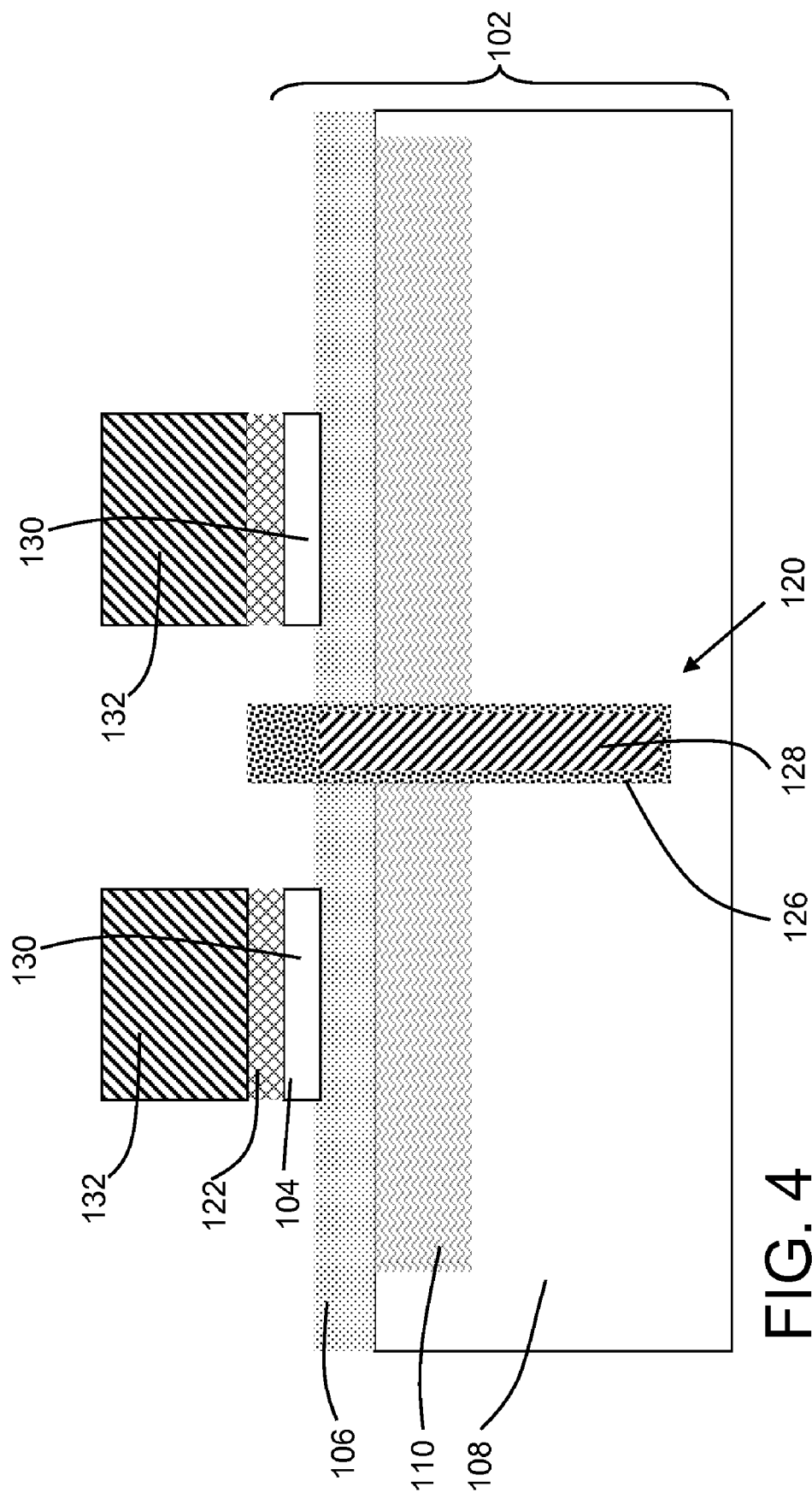
Figure 5:
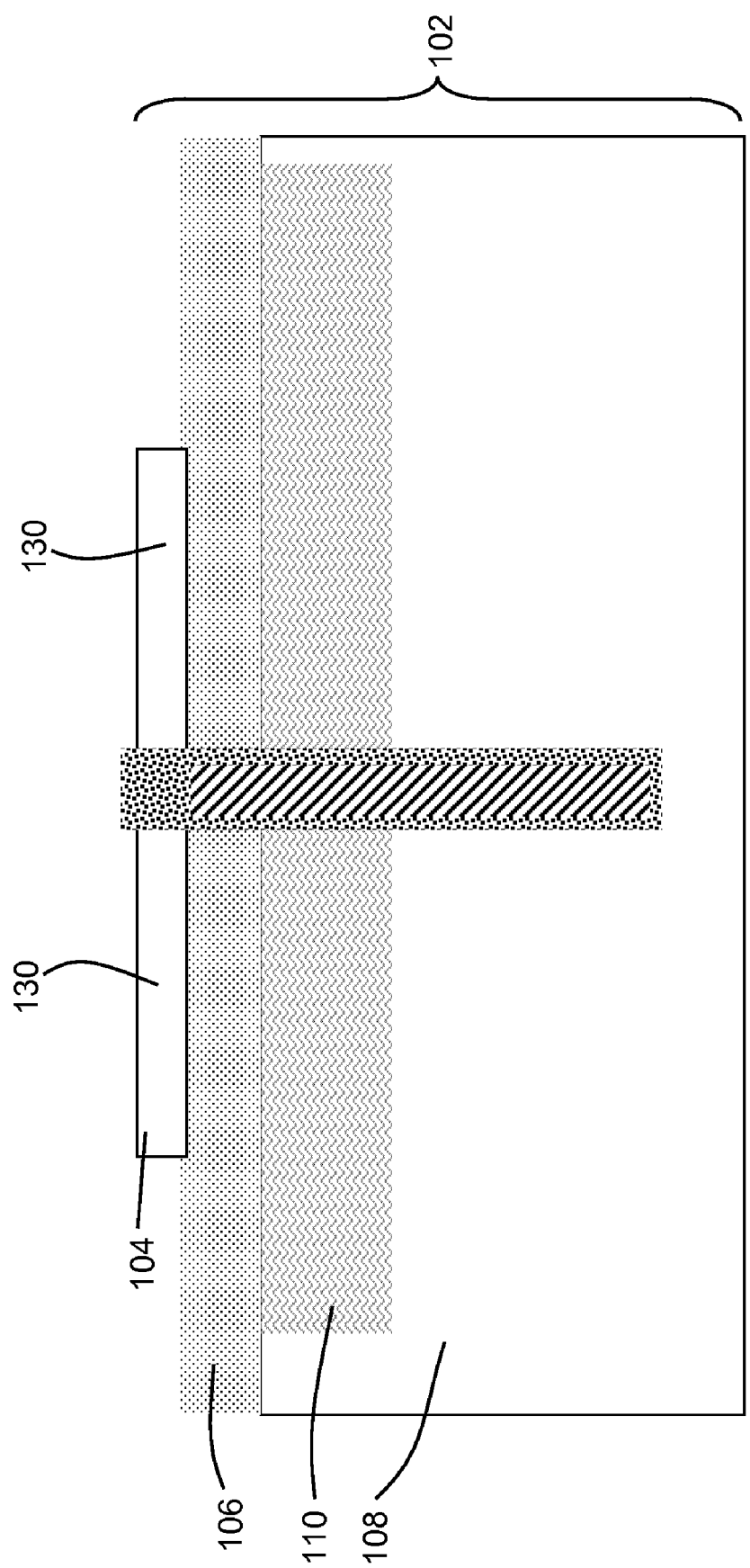

FIG. 3 also shows forming an active region 130 to each side of trench structure 120 in SOI layer 104. This process may include depositing, patterning and etching a mask 132, and etching SOI layer 104. As shown in FIG. 3, active regions 130 abut trench structure 120. However, as shown in FIG. 4, active regions 130 may be formed at a distance from trench structure 120 by forming mask 132 in two parts distanced from trench structure 120. Although not shown, as noted above, typical trench isolations (e.g., filled with silicon dioxide) may also be formed with trench structure 120. FIG. 5 shows the FIG. 3 embodiment after removal of any remaining portion of mask 132 (FIG. 3).

Figure 6:
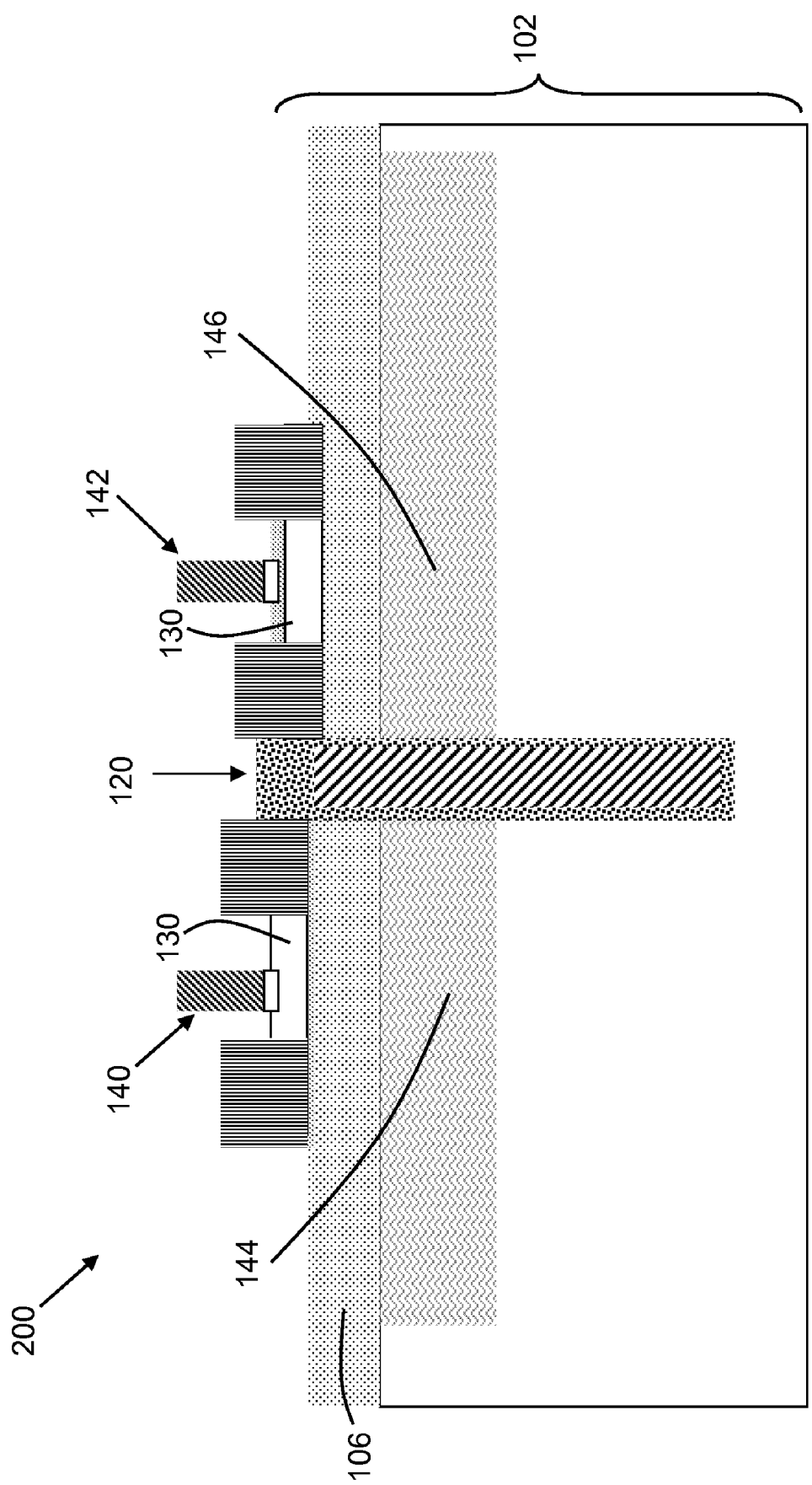
Figure 7:
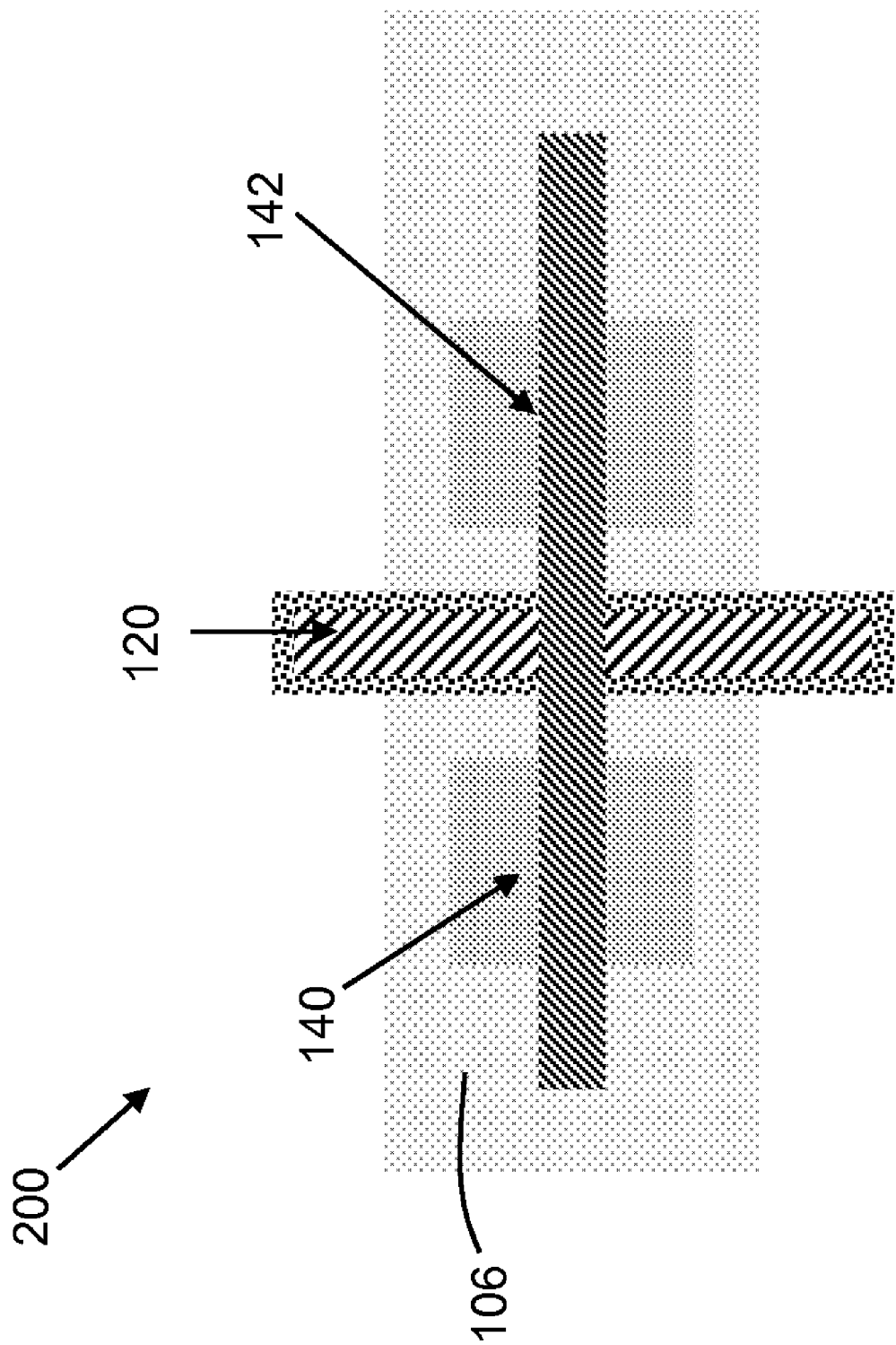

FIGS. 6-7 show forming a p-type field effect transistor (PFET) 140 (i.e., an FDSOI device) on active region 130 on one side of trench structure 120 and an n-type field effect transistor (NFET) 142 (i.e., an FDSOI device) on active region 130 on the other side of trench structure 120. The position of NFET 142 and PFET 140 may be switched, and furthermore the active regions of one or both FETs can be directly adjacent to the trench structure 120. PFET 140 and NFET 142 may be formed using any now known or later developed techniques. The resulting structure 200 includes a first FDSOI device 140 or 142 and a second FDSOI device 140 or 142 and a first well 144 below first FDSOI device 140 and a second well 146 below second FDSOI device 142, where first well 144 and second well 146 are isolated by a memory storage element trench structure 120. As such, trench structure 120 separates n-well 110 into a first well 144 and a second well 146 that constitute back gates for FDSOI device 140 and FDSOI device 142, respectively. First FDSOI device 140 and second FDSOI device 142 may be of the same or opposite polarities. As shown in FIG. 7, trench structure 120 allows FDSOI devices 140 and 142 to be formed isolated from one another without a density penalty and without the risk of out-diffusions of the n-well causing shorts.

Figure 8:
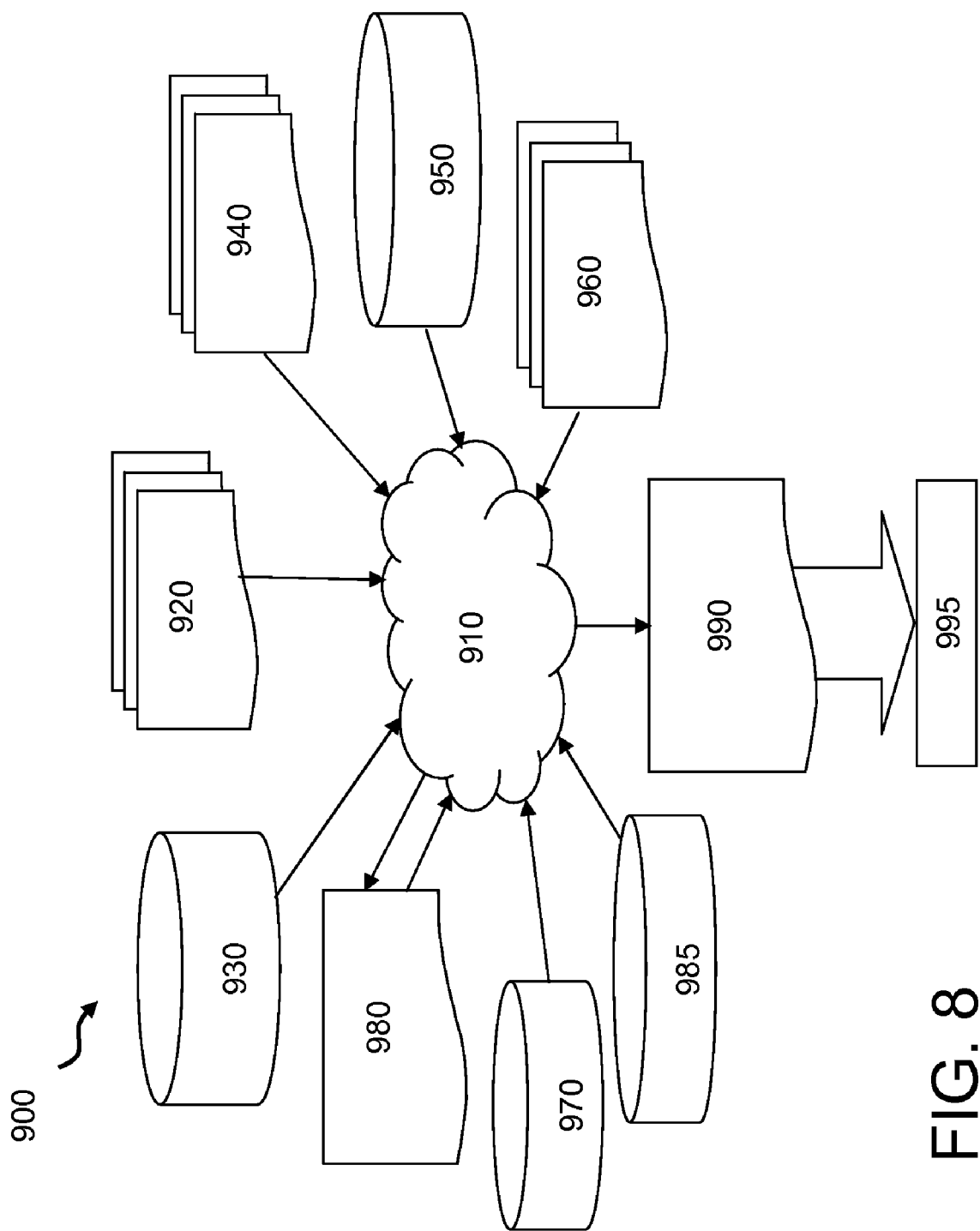
FIG. 8 shows a flow diagram of a design process used in semiconductor design, manufacture, and/or test.

FIG. 8 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 7 and 8 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 7 and 8. Design process 910 preferably synthesizes (or translates) an embodiment of the invention as shown in FIGS. 7 and 8 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is re-synthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 7 and 8, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 7 and 8. Design structure 990 may then proceed to a stage 995 where, for example, design structure 990: proceeds to tape-out, is released to manufacturing, is released to a mask house, is sent to another design house, is sent back to the customer, etc.

The methods and structures as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a first fully depleted semiconductor-on-insulator (FDSOI) device and a second FDSOI device; and
a first well below the first FDSOI device and a second well below the second FDSOI device,
wherein the first well and the second well are isolated by a memory storage element trench structure.

2. The structure of claim 1, wherein the first well and the second well constitute back gates for the first FDSOI device and the second FDSOI device, respectively.

3. The structure of claim 2, wherein the trench structure comprises a trench lined with a dielectric material, the trench further filled with a conductor adjacent to the dielectric material.

4. The structure of claim 1, wherein the first FDSOI device and the second FDSOI device are of the same polarity.

5. The structure of claim 1, wherein the first FDSOI device and the second FDSOI device are of opposite polarities.

6. The structure of claim 1, wherein the first FDSOI device includes an n-type field effect transistor (NFET) and the second FDSOI device includes a p-type FET.

7. The structure of claim 1, wherein the memory storage element trench structure constitutes a dynamic random access memory (DRAM) cell.

8. The structure of claim 1, wherein the memory storage element trench structure has a low aspect ratio rectangular shape.

9. The structure of claim 8, wherein the low aspect ratio is no greater than about 2:1.

10. A design structure embodied in a machine readable medium for designing, manufacturing, or testing an integrated circuit, the design structure comprising:
a first fully depleted semiconductor-on-insulator (FDSOI) device and a second FDSOI device; and
a first well below the first FDSOI device and a second well below the second FDSOI device,
wherein the first well and the second well are isolated by a memory storage element trench structure.

11. The design structure of claim 10, wherein the design structure comprises a netlist.

12. The design structure of claim 10, wherein the design structure resides on storage medium as a data format used for the exchange of layout data of integrated circuits.

13. The design structure of claim 10, wherein the design structure includes at least one of test data, characterization data, verification data, or design specifications.

14. The design structure of claim 10, wherein the first well and the second well are back gates for the first FDSOI device and the second FDSOI device, respectively.

15. The design structure of claim 14, wherein the trench structure comprises a trench lined with a dielectric material, the trench further filled with a conductor adjacent to the dielectric material.

16. The design structure of claim 10, wherein the first FDSOI device and the second FDSOI device are of the same polarity.

17. The design structure of claim 10, wherein the first FDSOI device and the second FDSOI device are of opposite polarities.

18. The design structure of claim 10, wherein the first FDSOI device includes an n-type field effect transistor (NFET) and the second FDSOI device includes a p-type FET.

19. The design structure of claim 10, wherein the memory storage element trench structure constitutes a dynamic random access memory (DRAM) cell.

20. The design structure of claim 10, wherein the memory storage element trench structure has a low aspect ratio rectangular shape.

* * * * *